(12) United States Patent
Kato et al.

(10) Patent No.: US 6,518,822 B1
(45) Date of Patent: *Feb. 11, 2003

(54) HIGH-FREQUENCY SWITCH

(75) Inventors: Mitsuhide Kato, Sabae (JP); Teruhisa Tsuru, Kameoka (JP)

(73) Assignee: Murata Manufacturing Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/567,128

(22) Filed: Dec. 4, 1995

(30) Foreign Application Priority Data

Dec. 5, 1994  (JP) ............................. 6-301105

(51) Int. Cl.[7] ................................. H01P 1/15
(52) U.S. Cl. ................... 327/494; 333/103; 333/104; 327/493
(58) Field of Search ................. 327/493, 494, 327/503, 504, 583, 584, 587, 497; 333/103, 104, 262, 101

(56) References Cited

U.S. PATENT DOCUMENTS

| | | | | |
|---|---|---|---|---|
| 3,475,700 A | * | 10/1969 | Ertel ........................... 333/104 |
| 4,542,300 A | | 9/1985 | Nagatomi .................... 330/103 |
| 5,170,139 A | * | 12/1992 | Nelson ........................ 333/103 |
| 5,375,257 A | * | 12/1994 | Lampen ....................... 333/103 |
| 5,507,011 A | * | 4/1996 | Chigodo et al. ............. 333/101 |
| 5,642,083 A | * | 6/1997 | Kato et al. ................... 333/494 |

FOREIGN PATENT DOCUMENTS

| | | |
|---|---|---|
| DE | 2652514 | 5/1978 |
| EP | 0194468 | 9/1986 |
| EP | 0508128 | 10/1992 |
| FR | 1548893 | 12/1968 |
| JP | 4140915 | 5/1992 |

* cited by examiner

Primary Examiner—Dinh T. Le
(74) Attorney, Agent, or Firm—Keating & Bennett, LLP

(57) ABSTRACT

In a high frequency switch, first and second diodes are respectively connected between first and second ports and between first and third ports so that they are directed in the same direction with respect to the first port. Coupling capacitors are connected on both sides of the respective diodes. Distributed constant lines and capacitors are connected between points of connection between the respective diodes and the corresponding capacitors, and reference potentials. Control voltage terminals are connected to points of connection between the distributed constant lines and the capacitors. A distributed constant line and a capacitor are connected between the first port and a reference potential. A fixed voltage terminal is connected through a resistor to a point of connection between the distributed constant line and the capacitor.

18 Claims, 5 Drawing Sheets

HIGH-FREQUENCY SWITCH

CROSS-REFERENCE TO RELATED APPLICATION

This application is related to commonly-assigned Ser. No. 08/563,590 (OFGS File P/1071-41) filed Nov. 28, 1995, the disclosures of which are incorporated by reference herein.

BACKGROUND OF THE INVENTION

1. Field of the Invention

The present invention relates to a high-frequency switch for changing signal paths in a high-frequency circuit, for example in a portable telephone, and more particularly to a high-frequency switch having four ports and utilizing diodes.

2. Background Art

In a portable telephone, in some cases, two antennas, or one antenna and one external terminal, are commonly used in a transmitter and a receiver. A conventional switch circuit having such a construction is illustrated in FIG. 7.

A switch circuit 151 has a construction wherein 3-port switches 152 and 153 are connected to each other. The switch 152 has first, second and third ports P21, P22 and P23. Similarly, the switch 153 has first to third ports P31, P32 and P33. An antenna ANT is connected to the second port P22 of the switch 152 and the third port P23 is used as an external connection terminal EXT. A second antenna is sometimes connected to the third port P23. That is, in a portable telephone for use in a vehicle or the like, a second antenna which is mounted on the vehicle can also be connected. As another example of use of the external connection terminal EXT, there are cases where a prescribed signal is input through the external terminal when measuring electrical characteristics of the receiver in a portable telephone containing the switch circuit 151 therein.

In the switch 152, the first port P21 can be changed over to the second port P22 or to the third port P23. The first port P21 is connected to a first port P31 of the switch 153.

The first port P31 of the switch 153 can be changed over between a second port P32 and a third port P33. The second port P32 is connected to the transmitter Tx and the third port P33 is connected to the receiver Rx.

By using the above-mentioned switch 151, either the antenna ANT or the external terminal EXT can be connected to either the transmitter Tx or the receiver Rx.

FIG. 8 shows a known type of high frequency switch using diodes which can constitute the 3-port switches 152 and 153. A high frequency switch 161 has first to third ports P61 to P63 corresponding to either the first to third ports P21 to P23 or to the first to third ports P31 to P33. The port P61 is connected through a capacitor 164 to a cathode of a diode 165a. One end of a distributed constant line 167a is electrically connected to a point A of connection between an anode of the diode 165a and a capacitor 166a. Assuming that the wavelength of a high frequency signal flowing through this switch 161 is λ, the distributed constant line 167a is composed of a transmission line having a length of λ/4 or less. The other end of the distributed constant line 167a is connected through a capacitor 168a to ground potential. One end of a resistor 169a is connected to a point of connection between the distributed constant line 167a and a capacitor 168a and the other end thereof is connected to a control voltage terminal Vc1.

Also, the first port P61 is connected through the capacitor 164 to a distributed constant line 171 constructed the same way as the distributed constant line 167a. The other end of the distributed constant line 171 is connected to ground potential.

Further, the cathode of a diode 165b is connected through the capacitor 164 to the first port P61. The anode of the diode 165b is connected through a capacitor 166b to the third port P63. Also, as with the diode 165a, a series circuit consisting of a distributed constant line 167b and a capacitor 168b is connected between the anode side of the diode 165b and ground potential. One end of a resistor 169b is connected to a point of connection between the distributed constant line 167b and the capacitor 168b and the other end thereof is connected to a control voltage terminal Vc2.

In the high frequency switch 161, by applying different control voltages to the control voltage terminal Vc1 and the second control voltage terminal Vc2, it is possible to realize a state of connection wherein the port P61 is connected to the second port P62 or wherein the port P61 is connected to the third port P63. For example, when a positive control voltage is applied to the control voltage terminal Vc1 and, on the other hand, a negative control voltage is applied to the control voltage terminal Vc2, a forward bias voltage is applied to the diode 165a and a reverse bias voltage is applied to the diode 165b. That is, since the capacitors 166a, 168a, 164, 166b and 168b block the flow of direct current, they block the control current supplied from the control voltage terminal Vc1 which is thereby caused to flow through a circuit portion including the distributed constant line 167a, the diode 165a and the distributed constant line 171. As a result, the diode 165a goes on. On the other hand, a reverse bias voltage is applied to the diode 165b, with the result that the diode 165b goes off.

Also, in order to guide the flow of a high frequency signal supplied from the second port P62, since the distributed constant line 167a is constructed as mentioned above, one end of the distributed constant line 167a can be set to have ground potential with respect to high frequencies by providing the capacitor 168a with a large capacitance. As a result, the impedance of a series circuit composed of the distributed constant line 167a and the capacitor 168a as viewed from the connection point A becomes infinite with respect to high frequencies by impedance inversion. Accordingly, a high frequency signal supplied from the second port P62 is caused to flow into the first port P61.

On the other hand, when a negative control voltage is applied to the first control voltage terminal Vc1 and a positive control voltage is applied to the second control voltage terminal Vc2, conversely to the above, a reverse bias voltage is applied to the diode 165a and a forward bias voltage is applied to the diode 165b. Accordingly, the diode 165a goes off and the diode 165b goes on. As a result, no signal flows between the second and first ports P62 and P61 and a signal flows between the first and third ports P61 and P63. In this case as well, since the impedance of a series circuit composed of the distributed constant line 167b and the capacitor 168b becomes infinite with respect to high frequencies, no high frequency signal flows in the distributed constant line 167b.

The distributed constant lines 167a and 167b respectively form the current paths for causing the control currents to flow through the diodes 165a and 165b and perform the function of increasing with respect to high frequency signals the impedances of the distributed constant lines 167a and 167b sides as viewed from the connection points A and B and thereby decreasing the insertion loss and reflection loss.

As mentioned above, in the high frequency switch 161, by applying positive and negative control voltages to the control voltage terminals Vc1 and Vc2, it is possible to terminate the connection between the first port P61 and the second port P62 and establish the connection between the first port P61 and the third port P63, and vice versa.

The switch circuit 151 illustrated in FIG. 7 is constructed using a pair of the high frequency switches 161 as the switches 152 and 153. That is, in the switch circuit 151, two 3-port high frequency switches are used and the first ports thereof are connected to each other.

As mentioned above, since the switch circuit 151 is constructed by connecting the two high frequency switches 152 and 153, a high frequency signal passes through the two switches. For example, a transmission output supplied from the transmitter Tx passes through the two switches 153 and 152 before arriving at the antenna ANT. Similarly, a high frequency signal input from the antenna ANT passes through the switches 152 and 153 before being supplied to the receiver Rx. For this reason, it is unavoidable that the insertion loss becomes large and it has been strongly demanded that this insertion loss be reduced. Another problem is that because of the unavoidable increase in insertion loss, it is necessary to increase the transmission output when transmitting, while, on the other hand, a decrease in the gain results when receiving.

In the above-mentioned switch circuit 151, since the switches 152 and 153 are each constructed using the high frequency switches 161, it is necessary in each of the switches 152 and 153 to apply control voltages to the first and second control voltage terminals and accordingly two power sources for supplying the control voltages have been needed in each of the switches 152 and 153. As a result, complex wiring patterns for the power sources have had to be formed on the circuit board.

SUMMARY OF THE INVENTION

An object of the present invention is to provide a high frequency switch in which the insertion loss is small, the number of the constituent parts can be reduced, and the wiring patterns for supplying the control voltages can be simplified.

In order to achieve the above object, according to a first aspect of the present invention, there is provided a high frequency switch having first to third ports and enabling changeover between a state of connection between the first and second ports and a state of connection between the first and third ports, comprising a first diode connected between the first and second ports; a second diode connected between the first and third ports, the first and second diodes being connected to the first port in the same direction with respect thereto, coupling capacitors connected between the first port and the first and second diodes, between the second port and the first diode, and between the third port and the second diode; distributed constant lines and capacitors connected in series with each other between the coupling capacitors connected to the first to third ports and reference potentials, and control voltage terminals connected to points of connection between the distributed constant lines and the capacitors; wherein a voltage having a fixed value is applied to the control voltage terminal connected to the point of connection between the distributed constant line and the capacitor connected to the first port.

According to a second aspect of the present invention, there is provided a high frequency switch having first to fourth ports and enabling changeover of each of the first and second ports between the third and fourth ports, comprising first to fourth diodes connected between the first and third ports, between the first and fourth ports, between the second and third ports and between the second and fourth ports, the first and second diodes being connected to the first port in the same direction with respect thereto and the third and fourth diodes being connected to the second port in the same direction with respect thereto, distributed constant lines and capacitors connected in series with each other between the third and fourth port sides of the first to fourth diodes and a reference potential, control voltage terminals connected to points of connection between the distributed constant lines and the capacitors, a pair of third distributed constant lines respectively connected between the first and second ports and the reference potential, a capacitor connected between the pair of third distributed constant lines and the reference potential, and a fixed voltage terminal connected to a point of connection between the third distributed constant lines and the capacitor and for having applied thereto a control voltage having a fixed value.

According to a third aspect of the present invention, there is provided a high frequency switch having first to fourth ports and enabling changeover of each of the first and second ports between the third and fourth ports, which comprises first to fourth diodes connected between the first and third ports, between the first and fourth ports, between the second and third ports, and between the second and fourth ports, the first and third diodes being connected to the third port in opposite directions and the second and fourth diodes being connected to the fourth port in opposite directions, distributed constant lines and capacitors connected in the series with each other between the first to fourth ports and reference potentials, fixed voltage terminals connected respectively to points of connection between the distributed constant lines and the capacitors in the series circuits composed of the distributed constant lines and capacitors connected to the first and second ports, for applying fixed voltages to the points of connection, and voltage control terminals connected to points of connection between the distributed constant lines and the capacitors in the series circuits composed of the distributed constant lines and capacitors connected to the third and fourth ports.

In the first aspect of the invention, a positive power source voltage Vcc, for example, can be applied to the control voltage terminal connected to the point of connection between the distributed constant line and the capacitor both connected to the second port, the control voltage terminal connected to the point of connection between the distributed constant line and the capacitor connected to the third port being grounded, and the control voltage terminal connected to the point of connection between the distributed constant line and capacitor connected to the first port being grounded. As a result, the first diode can be turned "on" and the second diode can be turned "off". That is, a signal can be caused to flow between the first and second ports by using only one type of power source voltage Vcc.

Conversely, a positive power source voltage Vcc, for example, can be applied to the control voltage terminal connected to the point of connection between the distributed constant line and capacitor connected to the third port, and each of the remaining control voltage terminals can be grounded. As a result, the first diode goes off and the second diode goes on, whereby it is possible to cause a signal to flow between the first and third ports.

When causing a signal to flow between the first and second ports or between the first and third ports, the impedance of a series circuit composed of the distributed constant line and the capacitor, as viewed from the end thereof which is opposite to the reference potential, becomes infinite with respect to high frequencies, so that a high frequency signal does not flow toward the reference potential. That is, this signal flows between the first and second ports or between the first and third ports as mentioned above.

Also, as apparent from embodiments described later, a voltage having a constant value which is applied to the control voltage terminal connected to the point of connection between the distributed constant line and the capacitor both connected to the first port need not be a positive power source voltage Vcc and may be a negative control voltage −Vcc, or may be grounded. This constant voltage is made equal to the control voltage applied to one of the remaining two control voltage terminals and defined as a second voltage, with the control voltage applied to the remaining one control voltage terminal being defined as a first voltage. In this case, since one of the first and second voltages can be set to have ground potential, according to the first aspect of the invention it is possible to realize a state of connection between the first and second ports or between the first and third ports by using only one control voltage Vcc or −Vcc.

Accordingly, it is possible to simplify the wiring patterns for supplying a power source voltage necessary for the high frequency switch and also to facilitate the design of a printed circuit board on which the high frequency switch is mounted. Accordingly, it is possible to promote miniaturization of an electronic device such as a portable telephone having the high frequency switch incorporated therein.

In the second aspect of the invention, by turning the first diode "on", a signal flows between the first and third ports and, in this case, the remaining second to fourth diodes are turned "off". Similarly, by turning the second diode "on", a signal flows between the first and fourth ports and, in this case, the remaining diodes are turned "off". Further, by turning the third diode "on", a signal flows between the second and third ports and, in this case, the remaining diodes are turned "off". Similarly, by turning the fourth diode "on", a signal flows between the second and fourth ports and the remaining diodes are turned "off".

That is, by applying the control voltages from the control voltage terminals so as to turn any one of the first to fourth diodes "on" as mentioned above, it is possible to realize a state wherein either the first or second port is connected to either the third or fourth port. In this case, as in the case of the first invention, a first voltage is applied as the control voltage to the control voltage terminal connected to the point of connection in the series circuit composed of the distributed constant line and the capacitor and connected to the diode desired to be turned "on" so that this diode goes on, and a second voltage different from the first control voltage is applied to each of the remaining control voltage terminals and the fixed voltage terminal. Furthermore, since one of the first and second voltages can be made to have ground potential, it is sufficient that only one control voltage be provided as in the case of the first aspect of the invention. Accordingly, it is possible to simplify the wiring patterns for supplying the power source voltage and therefore facilitate the design of the wiring patterns for supplying the power source voltage on a printed circuit board or the like, thereby enabling miniaturization of an electronic device as in the case of the first invention.

In addition, whereas when the switch circuit 151 is constructed using the conventional high frequency switches 152 and 153, a high frequency signal passes through two diodes, in the second aspect of the invention a high frequency signal passes through only one diode. Accordingly, the insertion loss can be reduced to ½ that in the case where the conventional switch circuit 151 is used, and the service life of the elements constituting the high frequency switch can also be increased. Thus, for example, when used in a portable telephone, the second aspect of the invention has the effect of reducing the consumption of batteries and enabling long-duration communication by telephone.

In the third aspect of the invention, by turning any two of the first to fourth diodes "on" and turning the remaining diodes "off", it is possible to realize a state of connection wherein either the first and third ports or the first and fourth ports are connected to either the second and third ports or the second and fourth ports. In the third aspect of the invention, when the high frequency switch thereof is used, a first voltage is applied to one of the pair of fixed voltage terminals respectively connected to the first and second ports and a second voltage is applied to the other thereof. One of the first and second voltages may be ground potential. Accordingly, each of the above-mentioned states of connection can be realized using only one control voltage. Accordingly, as in the case of the first and second aspects of the invention, since the wiring patterns for supplying the power source voltage can be simplified, it is possible to simplify the wiring patterns on a printed circuit board on which the high frequency switch is mounted, thereby enabling promotion of miniaturization of an electronic device such as a portable telephone in which the high frequency switch is incorporated.

Also, in an "on" state, a high frequency signal passes through only one diode as in the second aspect of the invention. Accordingly, the insertion loss can be reduced to ½ compared to the conventional switch circuit 151 using the 3-port high frequency switches 152 and 153. Further, whereas in the conventional switch circuit 151 six transmission lines were needed, in the third aspect of the invention only four transmission lines are needed. Accordingly, from this viewpoint as well, it is possible to achieve miniaturization of an electronic device such as a portable telephone in which the high frequency switch is incorporated.

A high frequency switch according to one of the above-mentioned first to third aspects of the present invention preferably further comprises a distributed constant line and a capacitor connected in series with each other and connected in parallel with at least one of the diodes. In a circuit construction wherein a distributed constant line and a capacitor connected in series are connected in parallel with at least one diode, a parallel resonance circuit is constructed by the capacitance and the impedance of the distributed constant line when this diode is in an "off" state. Accordingly, by making the resonance frequency of this parallel resonance circuit the same as the frequency of the high frequency signal flowing through the switch, it is possible to increase the impedance when the diode is in an "off" state, thereby enabling enhancement of the isolation characteristic. Note that in this case the capacitor functions to prevent bypass of a direct current to a circuit portion including the distributed constant line connected in parallel with the diode.

Preferably, at least one capacitor is connected between an end of at least one of the diodes and the reference potential. By connecting at least one capacitor between an end of at least one diode and the above-mentioned reference potential, it is possible to adjust the characteristic impedance by this capacitor, thereby enabling a decrease in the insertion loss and the reflection loss. Further, it is possible to shorten the length of the above-mentioned first distributed constant line, thereby contributing to miniaturizing the high frequency switch.

Preferably, a resistor is connected in parallel with at least one of the diodes. In a construction wherein a second resistor is connected in parallel with at least one diode, electric charge accumulated in the capacitance occurring when this diode is in an "off" state is discharged to this resistor simultaneously with changeover thereof to an "on" state. As a result, it is possible to smoothly perform a switching operation from the "off" state to the "on" state of the diode.

Other objects, features and advantages of the present invention will become apparent from the following description taken in conjunction with the accompanying drawings.

DETAILED DESCRIPTION OF EMBODIMENTS OF THE INVENTION

First Embodiment

The present invention will now be described on the basis of several preferred embodiments illustrated in the accompanying drawings.

Figure 1:
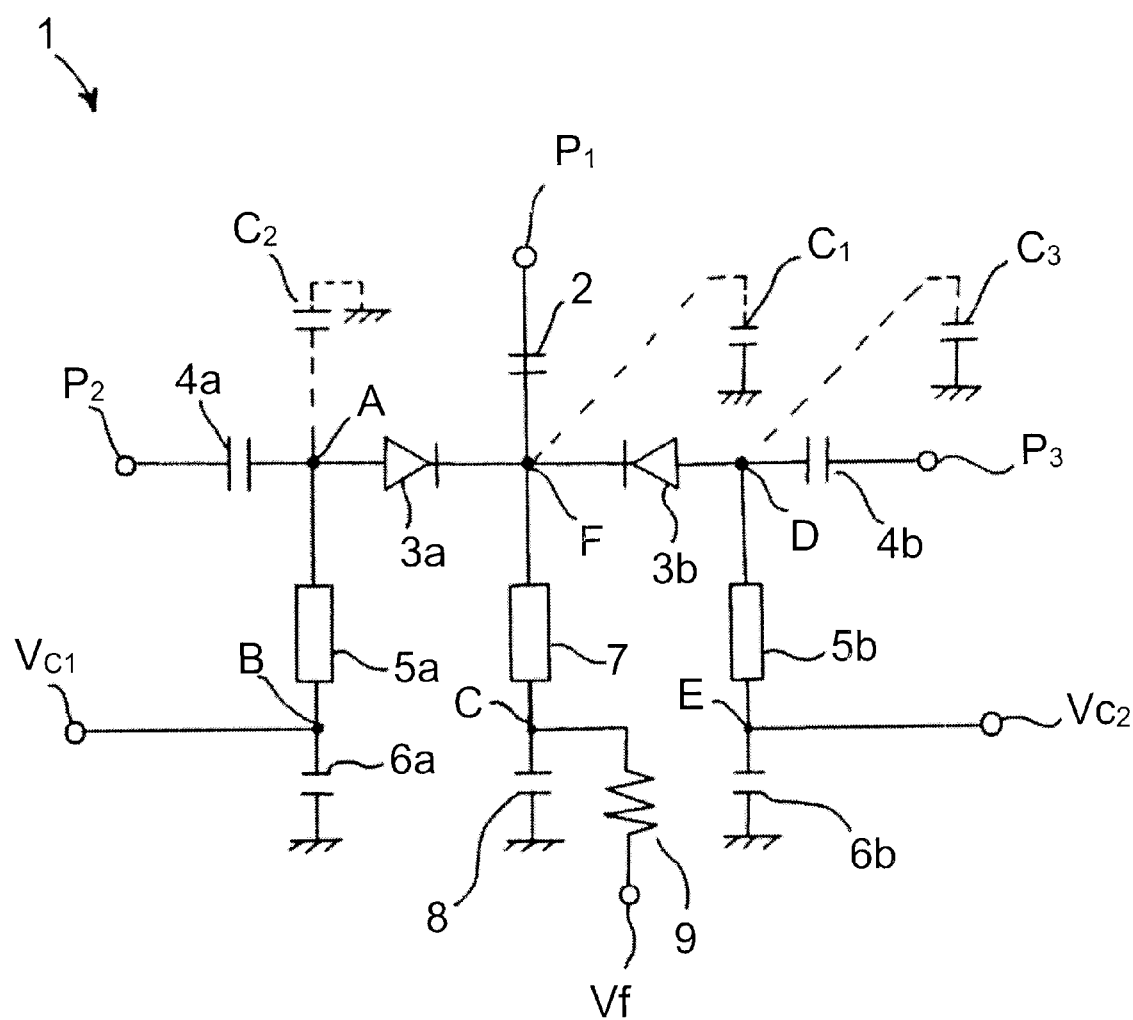
FIG. 1 is a circuit diagram illustrating a high frequency switch according to a first embodiment of the present invention.
Figure 8:
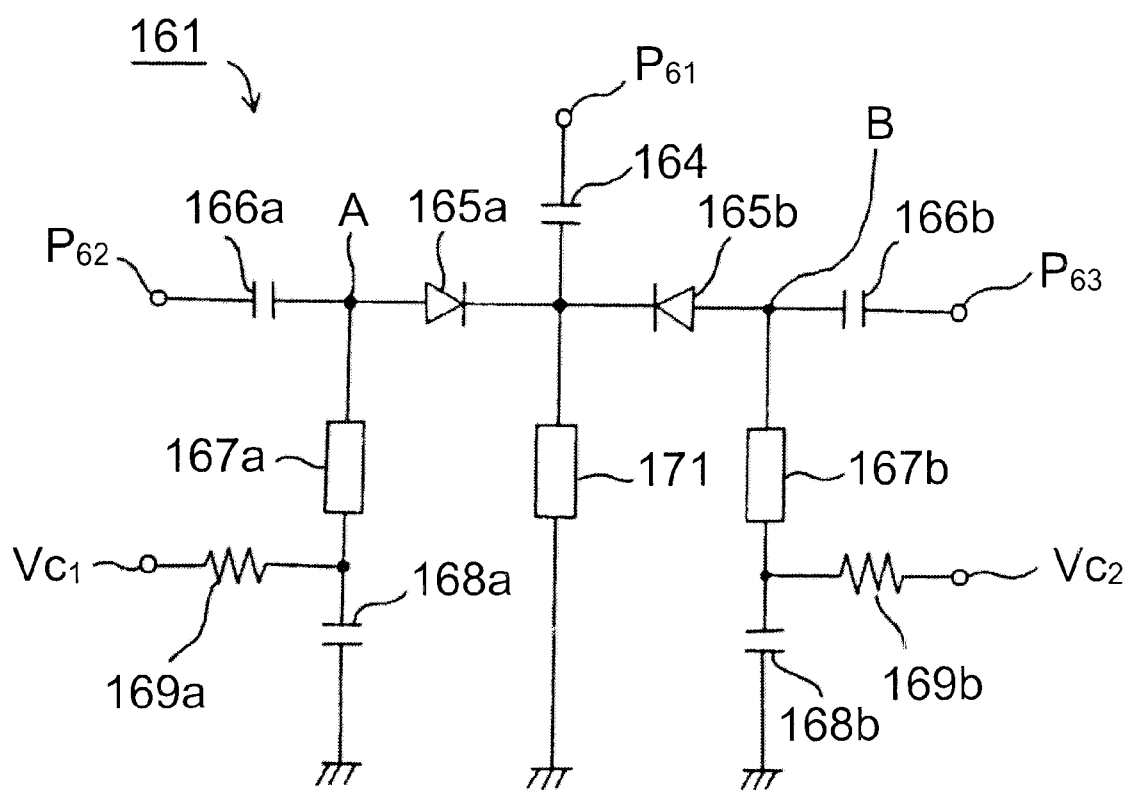
FIG. 8 is a circuit diagram illustrating an example of a conventional 3-port type high frequency switch.

FIG. 1 is a circuit diagram illustrating a high frequency switch according to a first embodiment of the invention of this application. A high frequency switch 1 is a 3-port high frequency switch having first to third ports P1 to P3. In the high frequency switch 1, a state wherein the first port P1 is connected to the second port P2 can be changed over to a state wherein the first port P1 is connected to the third port P3, and vice versa. That is, in the high frequency switch 1, the same changeover state as in the conventional high frequency switch 161 illustrated in FIG. 8 can be realized.

Figure 7:
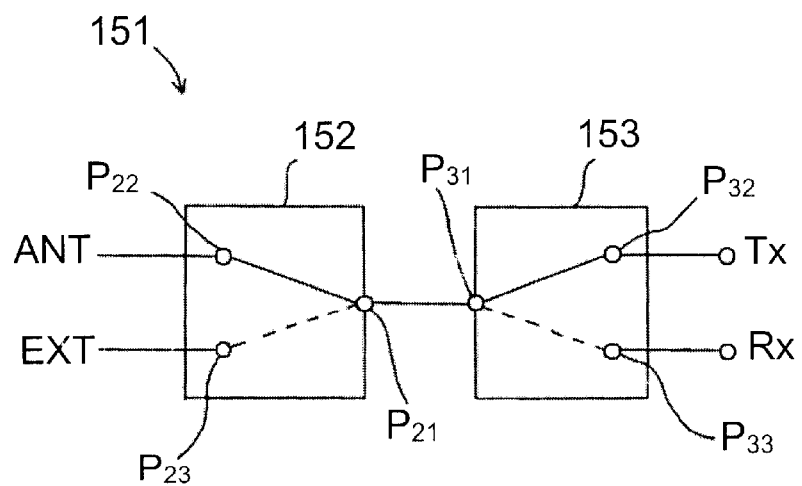
FIG. 7 is a schematic circuit diagram illustrating a conventional high frequency switch circuit.

Accordingly, by using two high frequency switches 1, it is possible to realize the switch circuit 151 illustrated in FIG. 7.

In the high frequency switch 1, cathodes of first and second diodes 3a and 3b are connected through a capacitor 2 to the first port P1.

An anode of the first diode 3a is connected through a capacitor 4a to the second port P2. One end of a distributed constant line 5a is connected to a point A of connection between the anode of the diode 3a and the capacitor 4a. Assuming the wavelength of a high frequency signal flowing through the switch 1 to be λ, the distributed constant line 5a is composed of a stripline, micro-stripline or co-planar guide line having a length of λ/4 or less. The other end of the distributed constant line 5a is connected through a capacitor 6a to ground potential. A control voltage terminal Vc1 is connected to a point B of connection between the distributed constant line 5a and the capacitor 6a.

Note that although the distributed constant line 5a is a so-called "λ/4 line", it is actually constructed so that it has a length of λ/4 or less as mentioned above because of line inductance and floating capacitance effects.

Also, the control voltage terminal Vc1 may be connected to the point B of connection through a resistor having an appropriate resistance value, whereupon a control voltage supplied to the connection point B can be adjusted.

The first port P1 is connected through a capacitor 2 to one end of a distributed constant line 7, the other end of which is connected through a capacitor 8 to ground potential. As in the case of the distributed constant line 5a, the distributed constant line 7 is formed having a length of λ/4 or less.

A control voltage terminal Vf for receiving a fixed control voltage is connected through a resistor 9 to a point C of connection between the distributed constant line 7 and a capacitor 8.

An anode of the second diode 3b is connected through a capacitor 4b to the third port P3. One end of a distributed constant line 5b is connected to a point D of connection between the anode of the second diode 3b and the capacitor 4b, and the other end thereof is connected through a capacitor 6b to ground potential. The distributed constant line 5b is constructed in the same manner as in the case of the distributed constant line 5a, and a control voltage terminal Vc2 is connected to a point E of connection between the distributed constant line 5b and the capacitor 6b. The control voltage terminal Vc2 may also be connected through a resistor to the point E of connection.

In the high frequency switch 1, a state wherein the first port P1 is connected to the second port P2 can be realized by applying a positive power source voltage +Vcc (first voltage) to the control voltage terminal Vc1 as a control voltage and connecting each of the control voltage terminals Vc2 and Vf to ground potential.

When a control voltage is applied as mentioned above, a forward bias voltage is applied to the first diode 3a and a reverse bias voltage is applied to the second diode 3b. That is, since each of the capacitors 2, 4a, 6a, 8, 4b and 6b block the flow of direct current therethrough, a control current supplied from the control voltage terminal Vc1 is blocked and flows through a circuit portion including the distributed constant line 5a, the diode 3a, the distributed constant line 7 and the resistor 9, with the result that the diode 3a goes on. Also, due to a reduction in voltage resulting from the flow of the control current through the resistor 9, the potential at the connection point F has a value obtained by subtracting a value corresponding to the voltage reduction in the diode 3a from the voltage Vcc. As a result, a reverse bias voltage is applied to the diode 3b with the result that the diode 3b goes off.

Meanwhile, by providing the capacitor 6a with a large capacitance, one end of the distributed constant line 5a can be set to be at ground potential with respect to high frequencies. Thus, the impedance of a series circuit composed of the distributed constant line 5a and the capacitor 6a as viewed from the connection point A is infinite with respect to high frequencies as a result of impedance inversion. Similarly, the impedance of the distributed constant line 7 as viewed from the connection point F is also infinite with respect to high frequencies. Accordingly, a high frequency signal flows between the first port P1 and the second port P2.

Conversely, when it is desired to realize a state wherein the first port P1 is connected to the third port P3, it is sufficient that a positive power source voltage +Vcc (first voltage) be applied to the second control voltage terminal Vc2 and both the control voltage terminal Vc1 and the control voltage Vf be grounded. Namely, it is sufficient that a voltage of 0V be applied as the second voltage. In this case, the second diode 3b goes on, the connection between the first and third ports is rendered effective, and the third diode 3a goes off. Also, since the impedances of the distributed constant lines 5b and 7 as viewed from the connection points D and F are infinite with respect to high frequencies, a high frequency signal does not flow from the connection points D and F toward the distributed constant lines 5b and 7. Accordingly, a high frequency signal flows between the first and third ports P1 and P3.

As mentioned above, the distributed constant lines 5a, 5b and 7 constitute the current paths for allowing the control currents to flow through the diodes 3a and 3b and, at the same time, function to increase the impedance with respect to high frequency signals on the distributed constant line side as viewed from the connection points A, D and F and thereby decrease the insertion loss and reflection loss.

Although in the above explanation a power source voltage +Vcc was applied as a first voltage to the first control voltage terminal Vc1 and a voltage of 0V was applied to each of the remaining control voltage terminals Vf and Vc2 in order to connect between the first and second ports P1 and P2 and, on the other hand, a power source voltage +Vcc was applied to the second control voltage terminal Vc2 and a voltage of 0V was applied to each of the remaining control voltage terminals Vc1 and Vf in order to connect between the first and third ports P1 and P3, the method of applying a control voltage is not limited thereto.

For example, by grounding the first control voltage terminal Vc1 so that a voltage of 0V is applied as a first voltage to the first control voltage terminal Vc1 and applying a negative power source voltage of −Vcc (second voltage) to each of the control voltage terminals Vf and Vc2, the first and second ports P1 and P2 may be connected to each other. Similarly, in order to realize a state of connection between the first and third ports P1 and P3, it is sufficient that the second control voltage terminal Vc2 be grounded so that a voltage of 0V (first voltage) is applied to the second control voltage terminal Vc2 and that, on the other hand, a negative power source voltage −Vcc (second voltage) be applied to each of the remaining control voltage terminals Vc1 and Vf.

In short, the voltage applied to each of the first and second control voltage terminals Vc1 and Vc2 can be determined in any suitable way such that the diode 3a goes on or off and the diode 3b goes on or off. Also, regarding the control voltage terminal Vf, in any state of connection between the first and second ports P1 and P2 or between the first and third ports P1 and P3, a fixed voltage is applied thereto.

Also, although in FIG. 1 the cathode sides of the diodes 3a and 3b were connected to the first port P1, the diodes 3a and 3b may be connected with their anode sides connected to the first port P1. In this case, by applying a control voltage to each of the control voltage terminals as shown in Table 1 below, it is possible to realize either the connection between the first and second ports P1 and P2 or the connection between the first and third ports P1 and P3.

TABLE 1

| State of Connection | Vc1 | Vc2 | Vf |
|---|---|---|---|
| P1 <−> P2 | 0 | +Vcc | +Vcc |
| P1 <−> P3 | +Vcc | 0 | +Vcc |
| P1 <−> P2 | −Vcc | 0 | 0 |
| P1 <−> P3 | 0 | −Vcc | 0 |

Also, in the above-mentioned embodiment, as illustrated by broken lines in FIG. 1, capacitors C1 to C3 may be connected between the first to third ports P1 to P3 and the reference potential. In this case, by selecting the capacitance of each of the capacitors C1 to C3, it is possible to compensate for the relevant characteristic impedance, thereby enabling effective decrease in the insertion loss and reflection loss of the high frequency switch 1. In addition, it is possible to decrease the length of each of the distributed constant lines 5a, 5b and 7, thereby enabling a reduction in the size of the high frequency switch 1.

Note that not all the capacitors C1 to C3 which are indicated by broken lines in FIG. 1 need always be used and, even if only one of them is connected, it would sufficiently serve the purpose.

As described above, in the high frequency switch 1 according to this embodiment, in order to realize states of connection between the first and second ports P1 and P2 and between the first and third ports P1 and P3, it is possible to use only one type of control voltage (Vcc or −Vcc) and ground potential. Accordingly, it is sufficient for only one type of power source voltage to be connected to the high frequency switch 1. Thus, it is seen that the wiring patterns for supplying the power source voltage can be simplified.

Second Embodiment

Figure 2:
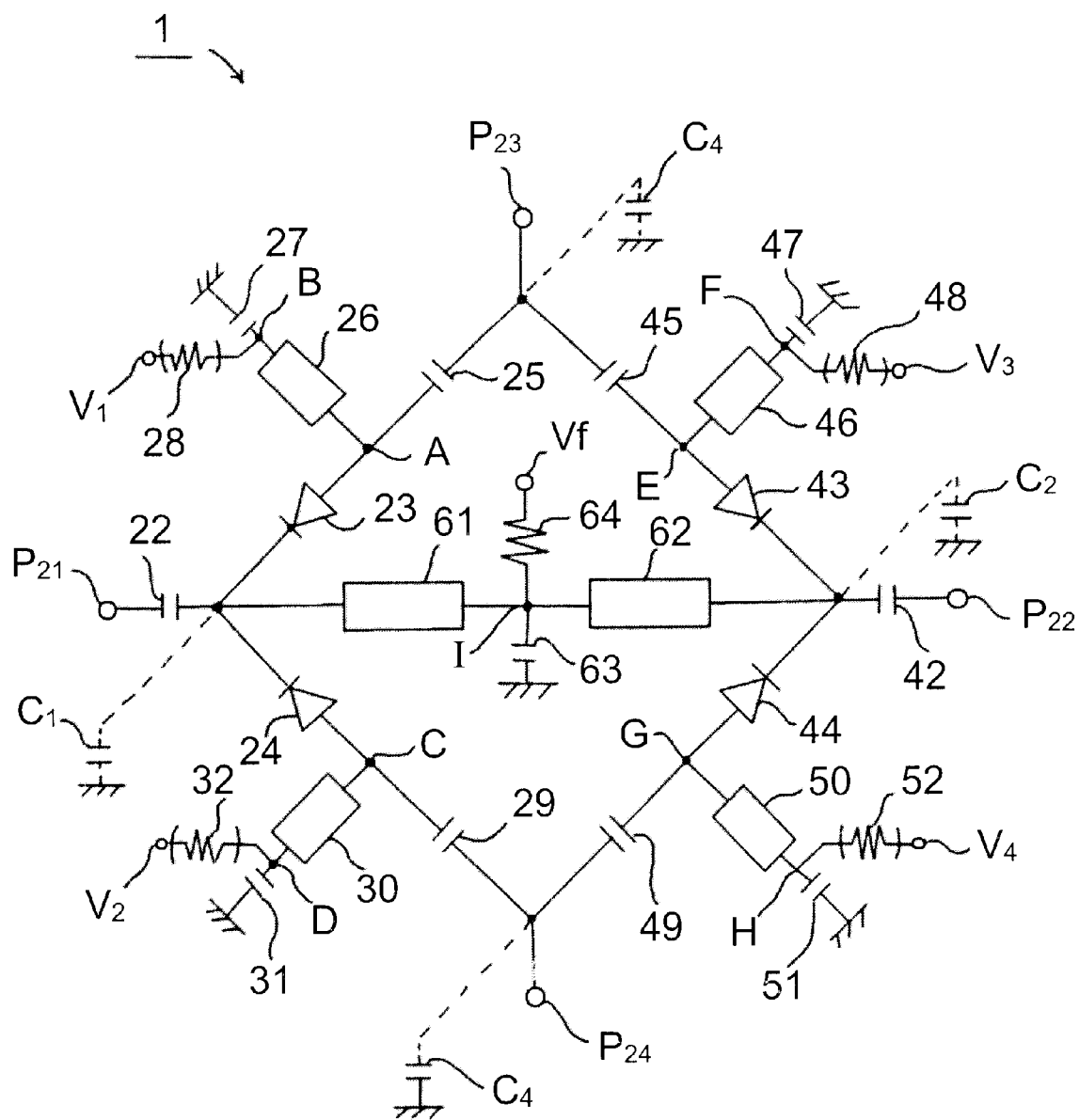
FIG. 2 is a circuit diagram illustrating a high frequency switch according to a second embodiment of the present invention.

FIG. 2 is a circuit diagram illustrating a high frequency switch according to a second embodiment of the present invention.

The high frequency switch 21 is a 4-port high frequency switch having first to fourth ports P21 to P24. The high frequency switch 21 is constructed for establishing a connection between the first and third ports P21 and P23, between the first and fourth ports P21 and P24, between the second and third ports P22 and P23, and between the second and fourth ports P22 and P24. In other words, either the first or second port P21 or P22 can be connected to either one of the remaining third and fourth ports P23 and P24.

By mere use of the above-mentioned high frequency switch 21, it is possible to construct the conventional switch circuit 151 illustrated in, for example, FIG. 7. In the switch circuit 151, when it is actually used, the antenna ANT is connected to the transmitter Tx or receiver Rx. Or, the external terminal EXT may be connected to the transmitter Tx or receiver Rx.

That is, when the switch circuit 151 is used, a connection can be made between the antenna ANT and the transmitter Tx (for transmission), a connection can be made between the external terminal EXT and the transmitter Tx (for transmission using an external antenna or when the characteristics of the transmitter are measured), and a connection can be made between the external terminal EXT and the receiver Rx (for reception using an external antenna or when the receiving characteristics of the receiver are measured). Accordingly, the high frequency switch 21 according to this embodiment can be caused to function in the same manner as in the case of the switch circuit 151, by connecting the first and second ports P21 and P22 to the antenna ANT or external terminal EXT respectively and connecting the third and fourth ports P23 and P24 to the transmitter Tx or receiver Rx respectively.

The construction and operation of the high frequency switch 21 will now be explained.

In the high frequency switch 21, cathodes of first and second diodes 23 and 24 are connected through a capacitor to the first port P21. An anode of the first diode 23 is connected through a capacitor 25 to the third port P23. Also, a distributed constant line 26 and a capacitor 27 are connected between a point A of connection between the anode of the first diode 23 and the capacitor 25 and ground potential. The distributed constant line 26 is composed of a stripline, a micro-stripline, co-planar guide line or the like, and is a 90° phase shifter or high impedance line having a length of ¼ of the wavelength λ of a high frequency signal flowing through the high frequency switch 21. This distributed constant line 26 is a so-called "λ/4 line". However, the length thereof can be shorter than λ/4 in order to take line inductance and floating capacitance effects into consideration. Also, one end of a resistor 28 is connected to a point B of connection between the distributed constant line 26 and the capacitor 27 and the other end thereof is connected to a first control voltage terminal V1.

Note that the resistor 28 is provided in order to adjust the control voltage applied from the control voltage terminal V1 and, therefore, need not always be provided, as indicated by the parentheses in FIG. 2.

Similarly, between the first and fourth ports P21 and P24, an anode of the second diode 24 is connected through a capacitor 29 to the fourth port P24. Also, a distributed constant line 30 constructed in the same manner as the distributed constant line 26 and a capacitor 31 are connected between a point C of connection between the anode of the diode 24 and the capacitor 29, and the ground potential. A second control voltage terminal V2 is connected through a resistor 32 to a point D of connection between the distributed constant line 30 and the capacitor 31. This resistor 32 need not always be provided as in the case of the resistor 28.

Meanwhile, the cathodes of third and fourth diodes 43 and 44 are connected through a capacitor 42 to the second port P22. The circuit construction between the second and third ports P22 and P23 and the circuit construction between the second and fourth ports P22 and P24 are the same as the circuit construction between the first and third ports P21 and P23 and the first and fourth ports P21 and P24. Accordingly, the corresponding components are denoted by the same reference numerals or symbols.

That is, a capacitor 45 and a distributed constant line 46 are connected to an anode of the third diode 43. Also, the above-mentioned distributed constant line 46 and a capacitor 47 are connected between a point E of connection between the anode of the diode 43 and the capacitor 45, and the ground potential. A point F of connection between the distributed constant line 46 and the capacitor 47 is connected through a resistor 48 to a third control voltage terminal V3.

Similarly, an anode of the fourth diode 44 is connected through a capacitor 49 to the fourth port P24. A point G of connection between the anode of the fourth diode 44 and the capacitor 49 is connected to the ground potential through a distributed constant line 50 and a capacitor 51 while, on the other hand, a point H of connection between the distributed constant line 50 and the capacitor 51 is connected through a resistor 52 to the fourth control voltage terminal V4.

Also, the first port P21 and the second port P22 are connected to each other by means of distributed constant lines 61 and 62 and the above-mentioned capacitors 22 and 42. Each of the distributed constant lines 61 and 62 is constructed in the same manner as the distributed constant line 26 and a point I of connection therebetween is connected through a capacitor 63 to the ground potential. Also, the point I of connection is connected through a resistor 64 to a fixed voltage terminal Vf.

The high frequency switch 21 corresponds to a structure comprising two high frequency switches 1 according to the first embodiment which are connected to each other. Namely, the high frequency switch 21 has the following structure: the first ports P1 of the two high frequency switches 1 are used respectively as the first and second ports P21 and P22 of FIG. 2; the two second ports P2 and two third ports P3 of the two high frequency switches 1 are respectively connected together and are respectively employed as the third and fourth ports P23 and P24 of FIG. 2; and the two control voltage terminals Vf of the two high frequency switches 1 are connected together as the fixed voltage terminal Vf of FIG. 2.

Next, the operation of the high frequency switch 21 will be explained.

First, an explanation will be given of a case where a high frequency signal is caused to flow between the first port P21 and third port P23.

In this case, as shown in Table 2 below, a positive power source voltage +Vcc is applied as a first voltage to the first control voltage terminal V1. On the other hand, the second to fourth control voltage terminals V2 to V4 and the fixed voltage terminal Vf are grounded. Namely, a voltage of 0V is adopted as a second voltage. As a result, a control current supplied from the control voltage terminal V1 is blocked by the capacitors 22, 25, 27, 29, 31, 42, 45, 47, 49, 51 and 63. Namely, these capacitors impose a limitation on the portion of the circuit where the control current can flow.

As a result, a forward bias voltage is applied to the first diode 23, whereby the first diode 23 goes on. Also, a reverse bias voltage is applied to each of the second to fourth diodes 24, 44 and 43, whereby these diodes each go off. Accordingly, a high frequency signal flows between the first and third ports P21 and P23. In this case, when the distributed constant line 26 is viewed from the connection point A, the impedance of a series circuit composed of the distributed constant line 26 and the capacitor 27 becomes infinite with respect to high frequencies. Therefore, a high frequency signal does not flow from the connection point A toward the distributed constant line 26.

Nor does a high frequency signal flow between the first and second ports P21 and P22. This is because when the distributed constant line 61 is viewed from the first port P21, the impedance of a series circuit composed of the distributed constant line 61 and the capacitor 63 becomes infinite with respect to high frequencies.

As mentioned above, by applying a positive power source voltage +Vcc to the first control voltage terminal V1 and grounding each of the remaining second to fourth control voltage terminals V2 to V4 and fixed voltage terminal Vf, the first state of connection can be realized, whereby a high frequency signal can flow between the first port P1 and the third port P3.

Similarly, as shown in Table 2 below, by applying a positive power source voltage +Vcc to any one of the second to fourth control voltage terminals V2 to V4 as a first voltage, and grounding each of the remaining control voltage terminals and the fixed voltage terminal Vf to thereby apply a voltage of 0V thereto as a second voltage, any one of the second to fourth diodes can be made "on" to thereby realize a state of connection between the first and fourth ports, between the second and third ports, or between the second and fourth ports.

TABLE 2

| State of Connection | V1 | V2 | V3 | V4 | Vf |
|---|---|---|---|---|---|
| P21–P23 | +Vcc | 0 | 0 | 0 | 0 |
| P21–P24 | 0 | +Vcc | 0 | 0 | 0 |
| P22–P23 | 0 | 0 | +Vcc | 0 | 0 |
| P22–P24 | 0 | 0 | 0 | +Vcc | 0 |

Further, as in the case of the first embodiment, 0V rather than +Vcc may be adopted as the above-mentioned first control voltage and –Vcc may be adopted as the second voltage.

Also, the high frequency switch 21 may be constructed with each of the first to fourth diodes in FIG. 2 connected in a direction opposite to that illustrated. In this case, the same states of connection as mentioned above can be realized by applying the control voltages as shown in Table 3 below. Alternatively, in this case as well, a voltage of 0V may be adopted as the first control voltage and a voltage of –Vcc may be adopted as the second voltage.

TABLE 3

| State of Connection | V1 | V2 | V3 | V4 | Vf |
|---|---|---|---|---|---|
| P21–P23 | 0 | +Vcc | +Vcc | +Vcc | +Vcc |
| P21–P24 | +Vcc | 0 | +Vcc | +Vcc | +Vcc |
| P22–P23 | +Vcc | +Vcc | 0 | +Vcc | +Vcc |
| P22–P24 | +Vcc | +Vcc | +Vcc | 0 | +Vcc |

As mentioned above, in the high frequency switch 21 according to this embodiment, by applying the first voltage to any one of the control voltage terminals V1 to V4 and applying the second voltage to each of the remaining control voltage terminals and to the fixed voltage terminal so that the diode disposed between the ports to be connected to each other goes on and each of the remaining diodes goes off, each of the above-mentioned states of connection can be realized. Since only one diode is "on" when the high frequency switch 21 is operated, the number of the diodes through which a high frequency signal passes is reduced to ½ of the corresponding number in the switch circuit 151 using the conventional high frequency switches 152 and 153. Therefore, the insertion loss can be reduced to ½ that in the conventional circuit.

In addition, in the high frequency switch 21 according to the second embodiment, by using the ground potential as either one of the first and second voltages, it is possible to perform changeover between the states of connection with the use of a single power source voltage alone. Accordingly, the wiring patterns for supplying the power source voltage can be simplified.

Also, when the high frequency switch 21 is in operation, only one diode goes on and there is also only bias circuit. Accordingly, it becomes possible to increase the service life of each of the elements constituting the high frequency switch 21. Also, it becomes possible to reduce the consumption of batteries in a portable telephone in which this part is incorporated and, thus, to communicate by telephone for longer periods of time.

Further, in the second embodiment as well, by connecting capacitors C1 to C4 between the ports P21 to P24 and the reference potential as indicated by broken lines, it is possible to adjust the characteristic impedance and thereby decrease the insertion loss and reflection loss of the high frequency switch 21. In addition, it is also possible to shorten the length of each of the distributed constant lines 26, 30, 46, 50, 61 and 62.

Third Embodiment

Figure 3:
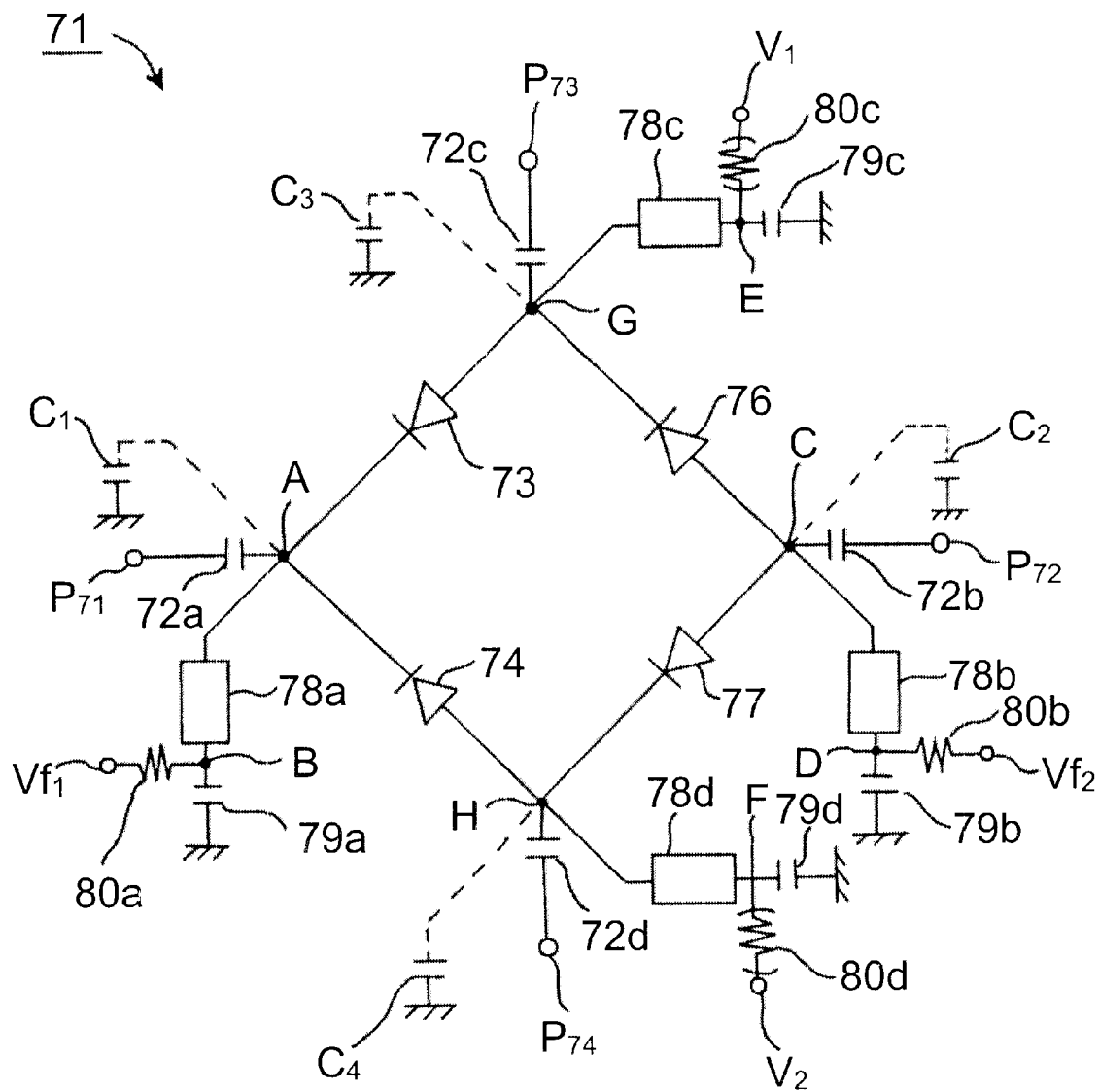
FIG. 3 is a circuit diagram illustrating a high frequency switch according to a third embodiment of the present invention.

FIG. 3 is a circuit diagram illustrating a high frequency switch 71 according to a third embodiment of the present invention of this application.

The high frequency switch 71 is a 4-port high frequency switch having first to fourth ports P71 to P74. This switch 71 is constructed for making the connection between the first and third ports P71 and P73; the connection between the second and fourth ports P72 and P74; the connection between the second and third ports P72 and P73; and the connection between the first and fourth ports P71 and P74.

In the high frequency switch 71, cathodes of first and second diodes 73 and 74 are connected through a capacitor 72a to the first port P71. Anodes of third and fourth diodes 76 and 77 are connected through a capacitor 72b to the second port P72. That is, the diodes 73 and 74 are connected to the first port P71 in the same direction with respect thereto, and the diodes 76 and 77 are connected to the second port P72 in the same direction with respect thereto. Also, the diodes 73 and 76 are connected to the third port P73 in opposite directions and the diodes 74 and 77 are connected to the fourth port P74 in opposite directions to each other.

A distributed constant line 78a and a capacitor 79a are connected between ground potential and a connection point A between the cathodes of the diodes 73 and 74. The point A is connected through a capacitor 72a to the first port P71. The distributed constant line 78a is composed of a stripline, a micro-stripline, a co-planar guide line or the like. It is a 90° phase shifter or high impedance line having a length of ¼ or less of the wavelength λ of a high frequency signal flowing through the high frequency switch 71. The distributed constant line naturally constitutes a λ/4 line. However, this line is constructed having a length of ¼ or less of the wavelength of the high frequency signal, because it is a common practice that that line be formed having a length shorter than λ/4 in order to take the impedance and floating capacitance of the line into consideration.

A first fixed voltage terminal Vf1 is connected through a resistor 80a to a point B of connection between the distributed constant line 78a and the capacitor 79a.

Similarly, three series circuits comprising distributed constant lines 78b, 78c and 78d and capacitors 79b, 79c and 79d are respectively connected to the second to fourth ports P72 to P74 (through respective capacitors 72b, 72c and 72d) and to the ground potential. A second fixed voltage terminal Vf2 is connected through a resistor 80b to a point D of connection between the distributed constant line 78b and the capacitor 79b. First and second control voltage terminals V1 and V2 are connected through resistors 80c and 80d to points E and F of connection between the distributed constant line 78c and 78d and the capacitors 79c and 79d, respectively.

Note that the resistors 80a to 80d need not always be provided.

Next, the operation of the high frequency switch 71 will be explained. First, an explanation will be given of a case where a high frequency signal is caused to flow between the first and third ports P71 and P73 and between the second and fourth ports P72 and P74. In this case, as shown in Table 4 below, the first fixed voltage terminal Vf1 is grounded, a positive power source voltage +Vcc is applied to the second fixed voltage terminal Vf2, a positive power source voltage +Vcc is applied to the first control voltage terminal V1, and the second control voltage terminal V2 is grounded.

As a result, since the capacitors 72a to 72d and 79a to 79d block the control current, this control current is caused to flow through a circuit portion enclosed by these capacitors. Accordingly, a forward bias voltage is applied to the first diode 73 with the result that this diode 73 goes on. Similarly, a forward bias voltage is applied to the fourth diode 77 with the result that this diode 77 goes on. On the other hand, a reverse bias voltage is applied to each of the second and third diodes 74 and 76 with the result that each of these diodes goes off.

As a result, a high frequency signal flows between the first and third ports P71 and P73 and between the second and fourth ports P72 and P74. In this case, for example, a high frequency signal does not flow from the connection point A toward the distributed constant line 78a. This is because a series circuit composed of the distributed constant line 78a and the capacitor 79a is connected between the connection point A and the ground potential, whereby the impedance thereof as viewed from the connection point A side becomes infinite with respect to high frequencies. Similarly, nor does a high frequency signal flow from the connection points C, G and H toward the distributed constant lines 78b to 78d respectively connected thereto.

Accordingly, as mentioned above, by applying a positive power source voltage +Vcc (first voltage) to the first control voltage terminal V1 and the second fixed voltage terminal Vf2 so that the first and fourth diodes 73 and 77 each go on and the remaining diodes each go off and grounding the remaining second control voltage terminal V2 and the first fixed voltage terminal Vf1 (second voltage=0V), the above-mentioned states of connection can be realized.

Conversely, when it is desired to realize the states of connection between the first and fourth ports P71 and P74 and between the second and third ports P72 and P73, it is sufficient that the control voltage be applied as shown in Table 4 below.

Accordingly, with the use of one type of power source voltage +Vcc alone, it is possible to realize the above-mentioned states of connection.

Although in the above explanation reference was made to the case where a positive power source voltage +Vcc was used, a negative power source voltage −Vcc may also be used. In this case, the control voltage can be applied as shown in Table 4 below.

TABLE 4

| State of Connection | Vf1 | Vf2 | V1 | V2 |
|---|---|---|---|---|
| P71 <−> P73<br>P72 <−> P74 | 0 | +Vcc | +Vcc | 0 |
| P71 <−> P74<br>P72 <−> P73 | 0 | +Vcc | 0 | +Vcc |
| P71 <−> P73<br>P72 <−> P74 | −Vcc | 0 | 0 | −Vcc |
| P71 <−> P74<br>P72 <−> P73 | −Vcc | 0 | −Vcc | 0 |

As mentioned above, in the high frequency switch 71 according to this embodiment, the high frequency signal which flows therethrough passes through a single diode only. For example, the high frequency signal which flows between the first port P71 and the third port P73 passes through the diode 73 only. Whereas in the conventional case, using the high frequency switches 152 and 153, a high frequency signal must pass through two diodes, in this embodiment it is sufficient that a high frequency signal passes through only one diode, with the result that the insertion loss can be reduced to ½ of that in the conventional case.

In addition, although in the conventional switch circuit 151 six transmission lines were needed, in this embodiment only four transmission lines to be connected to the four ports P71 to P74 are needed, whereby miniaturization of the high frequency circuit including the high frequency switch can be achieved.

In addition, since it is sufficient that only a single power source be used, it is possible to simplify the design of the wiring patterns for supplying the power source voltage, whereby a printed circuit board on which the high frequency switch 71 is mounted can be reduced in size.

Also, since the number of the resistance elements used can be reduced compared to the conventional structure using two high frequency switches 152 and 153, in a case where the high frequency switch 71 is constructed using, for example, a multi-layer substrate, the resulting switch circuit can be reduced in size and cost.

Also, in this third embodiment as well, capacitors C1 to C4 may be connected between the ports P71 to P74 and the ground potential, respectively, as indicated by broken lines. This enables adjustment of the characteristic impedance, a reduction in the insertion loss and reflection loss, and a decrease in length of the distributed constant lines 78a to 78d.

Also, the first and second diodes 73 and 74 and the third and fourth diodes 76 and 77 may be connected in the reverse directions to those illustrated in FIG. 3. In this case as well, it is possible to realize states of connection wherein the first and second ports P71 and P72 are respectively connected to the third and fourth ports P73 and P74, as in the above-mentioned case.

Modifications of the First to Third Embodiments

Next, preferred modifications which can be applied to the first to third embodiments will be explained with reference to FIGS. 4 to 6. In the modifications illustrated in FIGS. 4 to 6, additional circuit elements are connected to given diodes used in the above-mentioned first to third embodiments.

Figure 4:
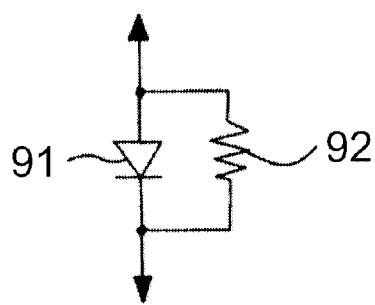
FIG. 4 is a circuit diagram illustrating a first modification of the high frequency switch.

As illustrated in FIG. 4, in a first modification, a discharge resistor 92 is connected in parallel with a diode 91. In the diode 91, when it is in an "off" state, the diode 91 functions as a capacitor in response to direct current. Accordingly, an electric charge which has been accumulated when the diode 91 is in an "off" state flows simultaneously with the turning-on of the diode. In the structure illustrated in FIG. 4, the accumulated charge is discharged to the discharge resistor 92, whereby the switching operation from the "off" state to the "on" state of the diode 91 is smoothly performed.

Figure 5:
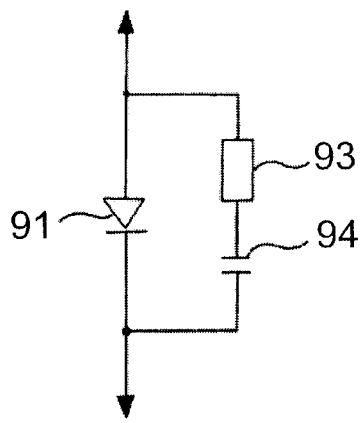
FIG. 5 is a circuit diagram illustrating a second modification of the high frequency switch.

Also, in a modification illustrated in FIG. 5, a distributed constant line 93 and a capacitor connected in series therewith are connected in parallel with the diode 91. In this structure, a parallel resonance circuit is constructed from the capacitance occurring when the diode 91 is "off" and the inductance of the distributed constant line 93. Accordingly, by adjusting the inductance of the distributed constant line 93 so that the resonance frequency of this parallel resonance circuit coincides with the frequency of a high frequency signal to be transmitted, it is possible to increase the impedance when the diode 91 is in an "off" state. As a result, it is possible to increase the isolation characteristic between the two adjacent ports with the diode 91 kept in an "off" state being disposed therebetween. Note that the capacitor 94 is provided for the purpose of preventing a direct current from being by-passed due to the distributed constant line 93.

Also, while the distributed constant line 93 can be composed of a stripline, a micro-stripline, a co-planar guide line or the like, the length and impedance thereof are selected so as to cause the resonance frequency of the parallel resonance circuit to coincide with the frequency of a high frequency signal.

Figure 6:
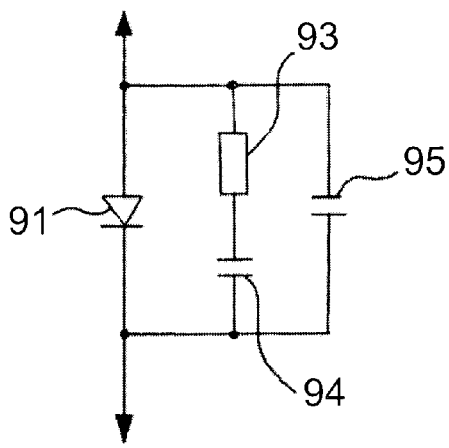
FIG. 6 is a circuit diagram illustrating a third modification of the high frequency switch.

In a modification illustrated in FIG. 6, a distributed constant line 93 for forming a parallel resonance circuit is connected in parallel with the diode 91. Also, a capacitor 94 is connected in series with the distributed constant line 93. Further, a capacitor 95 is connected in parallel with the diode 91, and is further connected in parallel with a circuit portion composed of the distributed constant line 93 and the capacitor 94. By adding the capacitor 95 to the structure of FIG. 5, when the capacitance occurring when the diode 91 is in an "off" state is small, a parallel resonance circuit can be constructed using a composite capacitance of the capacitance in an "off" state of the diode 91 and the capacitance of the capacitor 95, and the inductance of the distributed constant line 93, whereby it is possible to easily cause the resonance frequency of the parallel resonance circuit to coincide with the frequency of a high frequency signal.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high frequency switch having first to fourth ports and enabling connection of each of the first and second ports to either of the third and fourth ports, comprising:

a first diode coupled between the first and third ports;

a second diode coupled between the first and fourth ports;

the first and second diodes each having first and second polarity terminals, the first and second diodes being directly connected to each other at a first common connection, the first common connection being coupled to the first port whereby the first and second diodes are connected so that the same polarity terminal of each of the first and second diodes is coupled to the first port;

a first coupling capacitor connected between said first port and said first common connection; a second coupling capacitor connected between said third port and said first diode and a third coupling capacitor connected between said fourth port and said second diode;

and further comprising:

a third diode coupled between the second and third ports;

a fourth diode coupled between the second and fourth ports;

the third and fourth diodes each having first and second polarity terminals, the third and fourth diodes being directly connected to each other at a second common connection, the second common connection being connected to the second port whereby the third and fourth diodes are connected so that the same polarity terminal of each of the third and fourth diodes, which is the same polarity terminal as the terminals of the first and second diodes connected to the first port, is connected to the second port, and a fourth coupling capacitor connected between said second port and said second common connection of the third and fourth diodes, a fifth coupling capacitor connected between the third port and the third diode and a sixth coupling capacitor connected between the fourth port and the fourth diode;

a resistance element coupled to said first common connection of said first and second diodes and said second common connection of said third and fourth diodes, the resistance element being coupled to a first terminal which is isolated from the first and second common connections by the resistance element, a first potential being applied to said first terminal, said first potential comprising one of a positive voltage, an opposite negative voltage and a ground potential, the switch further comprising a second terminal coupled to a terminal of said first diode coupled to the third port, a third terminal coupled to a terminal of said second diode coupled to the fourth port, a fourth terminal connected to a terminal of said third diode coupled to the third port and a fifth terminal connected to a terminal of said fourth diode coupled to the fourth port, one of the first potential and ground potential being coupled to a first one of said second through fifth terminals, a remaining one of said first potential and ground potential not applied to said first one of said second through fifth terminals being applied to the remaining ones of the second to fifth terminals thereby coupling the first port to the third port or the fourth port and the second port to the third port or the fourth port, only a ground potential and a selected one of two opposite potentials being applied to said first through fifth terminals to actuate said switch.

2. The high frequency switch of claim 1, further comprising a distributed constant line and associated capacitor connected in series with each other and connected between a common connection of each diode and coupling capacitor and the ground potential, said second to fifth terminals being connected to respective common connections between each said distributed constant line and associated capacitor.

3. The high frequency switch of claim 2, further comprising a further distributed constant line respectively connected to each of the first and second ports and having a common connection between them, and further comprising a further capacitor connected between the common connection of the further distributed constant lines and the ground potential, said first terminal being connected to said common connection of said further distributed constant lines through said resistance element.

4. The high frequency switch of claim 1, further comprising an additional distributed constant line and additional capacitor connected in series with each other and together being connected in parallel with at least one of the diodes.

5. The high frequency switch of claim 1, further comprising a capacitor connected between an end of at least one of the diodes and the ground potential.

6. The high frequency switch of claim 1, further comprising a resistor connected in parallel with at least one of the diodes.

7. The high frequency switch of claim 4, further comprising a capacitor connected in parallel with said additional distributed constant line and additional capacitor connected in series.

8. A high frequency switch having first to third ports and enabling changeover between a state of connection between the first and second ports and a state of connection between the first and third ports, comprising:

a first diode coupled between the first and second ports;

a second diode coupled between the first and third ports;

the first and second diodes each having first and second polarity terminals, the first and second diodes being directly connected to each other with a common connection, the common connection being coupled to the first port such that the first and second diodes are connected whereby the same polarity terminal of each of the first and second diodes is coupled to the first port;

a first coupling capacitor connected between the first port and the common connection of the first and second diodes, a second coupling capacitor connected between the second port and the first diode and a third coupling capacitor connected between the third port and the second diode;

a resistance element being coupled between the common connection of the first and second diodes and a first terminal for applying a first potential thereto, said resistance element isolating said first potential from said first and second diodes, and the switch further comprising a second terminal coupled to the terminal of said first diode connected to the second port and a third terminal coupled to the terminal of said second diode connected to the third port for applying respectively a second potential to said first diode and a third potential to said second diode, one of a positive voltage, a negative voltage opposite said positive voltage and a ground potential being applied to said first terminal, the first potential or a ground potential being applied to a first one of said second and third terminals, a remaining one of said second and third terminals having applied thereto a remaining one of said first potential and said ground potential not applied to said first one of said second and third terminals, thereby to cause the connection between said first port and said second port or between said first port and said third port, only a ground potential and a one of two opposite potentials being applied to said first, second and third terminals to actuate the switch.

9. The high frequency switch of claim 8, further comprising a distributed constant line and associated capacitor connected in series with each other between each coupling capacitor connected to each of the first to third ports and said ground potential, said first to third terminals respectively connected to a common point between said distributed constant lines and said associated capacitors connected to each of said first to third ports.

10. The high frequency switch of claim 8, further comprising an additional distributed constant line and additional capacitor connected in series with each other and together being connected in parallel with at least one of the diodes.

11. The high frequency switch of claim 8, further comprising a capacitor connected between an end of at least one of the diodes and the ground potential.

12. The high frequency switch of claim 8, further comprising a resistor connected in parallel with at least one of the diodes.

13. The high frequency switch of claim 10, further comprising a capacitor connected in parallel with said additional distributed constant line and additional capacitor connected in series.

14. A high frequency switch having first to fourth ports and enabling connection of each of the first and second ports to either of the third and fourth ports, comprising:

a first diode coupled between the first and third ports;

a second diode coupled between the first and fourth ports;

the first and second diodes each having first and second polarity terminals, the first and second diodes being directly connected to each other at a first common connection, the common connection being coupled to the first port so that the first and second diodes are connected whereby the same polarity terminal of each of the first and second diodes is coupled to the first port;

a first coupling capacitor connected between said first port and said first common connection of said first and second diodes; and further comprising:

a third diode coupled between the second and third ports;

a fourth diode coupled between the second and fourth ports;

the third and fourth diodes each having first and second polarity terminals, the third and fourth diodes being directly connected to each other at a second common connection; the second common connection being coupled to the second port so that the second and third diodes are connected whereby the same polarity terminal of each of the third and fourth diodes, which is the opposite polarity terminal of the terminal of the first and second diodes connected to the first port, is coupled to the second port;

a second coupling capacitor connected between said second port and said second common connection of said third and fourth diodes;

and further comprising a third coupling capacitor connecting said third port and said first and third diodes and a fourth coupling capacitor connecting said fourth port and said second and fourth diodes;

said first common connection of said first and second diodes forming a first node, the second common connection of said third and fourth diodes forming a second node, a third common connection of said first and third diodes forming a third node and a fourth common connection of said second and fourth diodes forming a fourth node, only said first diode being connected between said first and third nodes, only said second diode being connected between said first and fourth nodes, only said third diode being connected between said second and third nodes and only said fourth diode being connected between said second and fourth nodes, a ground potential being provided at a first one of said first node and said second node, a first potential comprising one of a positive potential and an opposite negative potential being provided to a remaining one of said first node and said second node, a one of said first potential and ground potential being provided at a first one of said third node and fourth node, a remaining one of said first potential and said ground potential not applied to the first one of the third node and fourth node being provided at a remaining one of said third node and fourth node, thereby to cause connection between said first port and said third port or fourth port and connection between said second port and said third port or fourth port, only a ground potential and a one of a positive potential and an opposite negative potential being applied to said first to fourth nodes to actuate the switch.

15. The high frequency switch of claim 14, further comprising/an additional distributed constant line and additional capacitor connected in series with each other and together being connected in parallel with at least one of the diodes.

16. The high frequency switch of claim 14, further comprising a capacitor connected between an end of at least one of the diodes and the around potential.

17. The high frequency switch of claim 14, further comprising a resistor connected in parallel with at least one of the diodes.

18. The high frequency switch of claim 15, further comprising a capacitor connected in parallel with said additional distributed constant line and additional capacitor connected in series.

* * * * *